United States Patent [19]

Forsterling et al.

[11] Patent Number: 4,781,788
[45] Date of Patent: Nov. 1, 1988

[54] PROCESS FOR PREPARING PRINTED CIRCUIT BOARDS

[75] Inventors: Robert B. Forsterling, Kokomo, Ind.; Crystal M. Frailey, Union, Mo.

[73] Assignee: Delco Electronics Corporation, Kokomo, Ind.

[21] Appl. No.: 44,042

[22] Filed: Apr. 29, 1987

Related U.S. Application Data

[63] Continuation-in-part of Ser. No. 947,195, Dec. 29, 1986, abandoned.

[51] Int. Cl.$^4$ .................... C23C 18/00; C23F 1/00
[52] U.S. Cl. ..................... 156/630; 156/666; 156/668; 156/902; 427/306; 427/307
[58] Field of Search .............. 156/630, 668, 901, 902, 156/666; 427/98, 299, 305, 306, 307; 437/230, 245

[56] References Cited

U.S. PATENT DOCUMENTS

| | | | |
|---|---|---|---|
| 3,950,570 | 4/1976 | Kenney | 427/98 |
| 4,035,227 | 7/1977 | Doty et al. | 427/306 X |
| 4,035,500 | 7/1977 | Dafter, Jr. | 427/306 X |
| 4,080,246 | 3/1978 | Battisti et al. | 156/656 |
| 4,178,403 | 12/1979 | Sakurai et al. | 428/209 |
| 4,226,108 | 10/1980 | Nakanishi et al. | 29/603 |
| 4,246,328 | 1/1981 | Sato et al. | 430/5 |
| 4,297,436 | 10/1981 | Kubotera et al. | 430/310 |
| 4,358,479 | 11/1982 | Canestaro et al. | 156/630 X |
| 4,395,313 | 7/1983 | Lindsay et al. | 204/30 |
| 4,448,804 | 5/1984 | Amelio et al. | 156/630 X |
| 4,532,887 | 8/1985 | Forsterling | 427/306 X |
| 4,597,828 | 7/1986 | Tadros | 156/668 X |
| 4,600,480 | 7/1986 | Coombes et al. | 427/305 X |
| 4,601,784 | 7/1986 | Krulik | 156/668 X |
| 4,629,636 | 12/1986 | Courduvelis et al. | 156/668 X |
| 4,639,380 | 1/1987 | Amelio et al. | 427/98 X |

Primary Examiner—David L. Lacey
Assistant Examiner—Andrew J. Anderson
Attorney, Agent, or Firm—Domenica N. S. Hartman

[57] ABSTRACT

Boards coated with electroless plated copper to a thickness of less than 0.1 mil are achieved by stripping completely the copper from commercially available boards with copper cladding of about 0.7 mil thickness, treating the stripped board with a ceric sulphate solution and then electroless plating of the copper to the desired thickness in conventional manner.

15 Claims, 1 Drawing Sheet

PROCESS FOR PREPARING PRINTED CIRCUIT BOARDS

CROSS-REFERENCE

This application is a continuation-in-part of U.S. patent application Ser. No. 947,195, filed Dec. 29, 1986, now abandoned and having a common assignee.

FIELD OF THE INVENTION

This invention relates to the preparation of printed circuit boards.

BACKGROUND OF THE INVENTION

Currently it is common practice, for making printed circuit boards, to purchase insulated panels or boards, both of whose opposite main surfaces are copper clad, and then to pattern the copper cladding to achieve the desired circuitry. These copper-clad boards are prepared by pressing a copper foil on the board after first providing a thin zinc-copper layer there between to promote adhesion between the copper and the board. The copper cladding typically is about 0.7 mil thick, which is thicker than optimum, but because of the process used for cladding, it is difficult to provide thinner copper layers reliably and inexpensively. For use in printed circuit boards layers of this thickness require unduly long times and large amounts of chemicals for patterning and so increase the cost. Also such thicknesses can result in high steps at pattern edges which can give rise to problems. There accordingly is a need for copper-coated boards with thinner copper coatings for use in making printed circuit boards and the present invention is directed to this end.

Printed circuit boards with relatively thin layers of electroless copper, which are held to the boards by adhesive, are commercially available but are not as reliable as is required in some applications.

One proposed solution has been to prepare the boards by electroless copper plating. However, it has proven difficult, even with the use of adhesives, to provide coatings of the desired thinness which are continuous and uniform and have the required high resistance to peeling under operating conditions.

SUMMARY OF THE INVENTION

We have found a process for electroless plating of insulated boards with copper layers which are less than 0.1 mil thick, are uniform, and have the desired high resistance to peeling. Boards so plated are well adapted to patterning into printed circuit boards.

In particular, we have discovered that insulated boards, particularly when such boards comprise a lamination of glass fibers in an epoxy binder, (which is characteristic of the boards typically used presently for printed circuits) which have been mechanically worked to form microstructure roughness on their surfaces, (as happens when copper foil is bonded to the surfaces by pressing or rolling can have thin layers of electroless copper plated to such surfaces with relatively high peel resistance. Moreover, we have discovered that if such boards are treated with a tetravalent cerium compound, preferably ceric sulphate, before the plating, the reliability of the plating is enhanced significantly. In particular, we have found that if the thick copper-clad boards, of the kind commercially available, are first treated to remove the copper and then immersed in a ceric sulphate solution, electroless copper can be plated thereover in layers which have thicknesses of less than 0.1 mil, have the desired peel strength and are otherwise well suited for patterning into printed circuits.

Additionally, we have found that adhesion of the copper to the board is enhanced by special attention to the rinsing steps following the usual activation and acceleration treatments used in preparing the boards for the actual plating steps.

In particular, it was found that copper to laminate adhesion was improved by using vigorous agitation by bubbling air in the rinse following activation. Adhesion was also enhanced by avoiding bubbling air in the accelerator rinse for little agitation and mild air bubbling for mild agitation in the copper bath.

Additionally, it was found advantageous to acidify the rinses to reduce hydrolysis. To this end, it was found particularly advantageous to add sulfuric acid to the rinse after the novel cerium treatment and hydrochloric acid in the activator rinse.

Various other modifications in the process described in the parent case were found advantageous and will be discussed more specifically below.

BRIEF DESCRIPTION OF THE DRAWING

The drawing shows in block form the sequence of basic steps in a preferred embodiment of the invention. In the interest of simplicity, the rinsing and cleaning treatments normally associated with some of the steps depicted have not been shown separately but are intended to be encompassed within such depicted steps.

DETAILED DESCRIPTION

In accordance with a preferred embodiment of this invention the preparation of a circuit board for use to provide a printed circuit generally begins with commercially available boards, for example those designated FR-4 and FR-5, manufactured by either the Westinghouse Corp. or the NVF Corp. Such boards comprise a laminate of glass fiber layers bonded together with an epoxy resin, have a nominal thickness of about 47 to 59 mils and have a copper cladding on each surface of about 0.7 mil thick. The thickness of the board is not believed a limiting factor. A thin layer of a zinc-copper alloy apparently is used between the copper cladding and the board to promote adhesion. A thin foil of copper is pressed at elevated temperature to a bare board. Because of the manner in which the copper is bonded to the board, it is difficult to use thinner layers of copper reliably. Boards formed of polyimide materials may also be used.

As was mentioned earlier, this copper is thicker than desirable for the fine pattern printed circuits of primary importance in present day electronic apparatus. In particular, the pattern etching of such thick layers tends to be slow and to consume a lot of expensive chemicals, and so to add significantly to the cost of manufacture.

Moreover hitherto, there appear to be no more attractive alternatives to use of such boards as the starting material. Attempts to plate copper of the desired thinness on bare virgin commercially available boards without the use of adhesives have not been successful, largely because of adhesion problems.

We have discovered that the adhesion problem can be essentially overcome by plating bare boards which had been originally clad, but from which the cladding and its adhesive material had been removed. It appears that the pressing treatment used to bond the copper cladding results in a mechanical working of the surface of the board that conditions the board topography to accept more tenaciously a subsequently plated copper layer, particularly when the board is treated, for example in the manner to be described, preliminary to such plating.

Microscopic inspection of the surface of the board after removal of the copper cladding shows microstructure that is believed to promote the adhesion of the later plated copper. Moreover, inspection of the board before and after the treatment to be described, indicates that the treatment better conditions the surface for copper adhesion by reducing any particulate matter on the surface, typically glass fiber or epoxy fragments, entrapped by the surface roughness, that might otherwise impede adhesion of the plated copper.

Before removal of the copper cladding from the board, for the case of simple two-layer boards, it is advantageous first to drill the via holes needed in the board so as to permit connection between the copper patterns on opposite surfaces of the board. However, in the case of multilayer boards, the drilling of the via holes should follow the removal of the copper cladding lest such removal process undesirably etch the copper of the intermediate layers at the hole edges. It is usual to place a thin plate of aluminum over the boards before the mechanical drilling of the holes to minimize drilling burrs.

After the formation of the via holes, the cleaner-conditioner is used and then the copper clad is removed from the opposite surfaces of the board. This can be readily done in known fashion by etching either with a solution of copper chloride ($CuCl_2$) or a solution which includes hydrogen peroxide ($H_2O_2$) and sulfuric acid ($H_2SO_4$).

As previously mentioned, at this stage the board has a surface microstructure which is already quite conducive to electroless plating. It has been experimentally determined that boards of FR-4, FR-5 and polyimide materials, which contained a copper cladding that was removed, readily accepted a relatively thin electroless copper layer which was found to have good coverage (few pin holes) and good adhesion. However, for improved results it has been found desirable first to treat the surface with a strong oxidizing solution, able to reduce the particulate matter on the surface. An aqueous cerium sulfate $Ce(SO_4)_2$ solution, of a concentration of 0.05–0.1 moles per liter was found particularly satisfactory although solutions as weak as 0.02 moles can be used successfully. Although a wide range of temperatures has proven useful, the best results were found in the range of 100 degrees to 120 degrees Fahrenheit and in the range above 180 degrees Fahrenheit. Generally, the higher the temperatue used, the shorter the time needed. Ceric sulphate is readily available and its use creates no serious environmental problems. Typical treatment involved immersion for about three minutes in a 0.06 molar solution at about 100 degrees Fahrenheit. As indicated above, a wider range of conditions is feasible. As previously discussed, this treatment serves to oxidize any particulate matter, such as glass fiber or epoxy fragments, which may be entrapped in the surface microstructure, and thereby to more completely bare the surface to promote adhesion of the plated copper. Other tetravalent cerium compounds, such as ceric ammonium sulphate $Ce(NH_4)_6(SO_4)_4$ should also prove useful. Similarly other strong oxidizing agents such as $Na_2S_2O_8$ and mixtures of $H_2O_2$ and $H_2SO_4$ are possible alternatives, although likely to be less effective.

After the ceric sulphate treatment, the board is rinsed in deionized water, advantageously slightly acidified with sulfuric acid to minimize hydrolysis. The various rinses used involved optimally either deionized water or reverse osmosis water, sometimes acidified as will be noted.

It has sometimes been found advantageous, before complete copper removal, to wash the board in a cleaner-conditioner solution for about five minutes to clean off any organic residues and to better condition the surface for plating, especially the via holes. Typical is an acidic cleaner with surfactants for conditioning such as commercially available Enthone 7753 or PC475.

It also has been found advantageous sometimes to practice such a wash after the ceric sulphate treatment, as well as before. In practice, it appears best to practice such a relatively long wash before the novel treatment, as described above, and then to include a shorter, e.g., about thirty seconds, wash after the novel treatment.

At this stage, the board is ready for electroless-copper plating in the usual fashion. Of particular importance, however, it is now feasible to achieve reliable adhesion of electroless plated copper on bare boards. In order to conserve chemicals used for etching the copper, the thickness would typically be approximately 0.16 mil or less. The thickness of the electroless copper can be 0.1 mil and possibly down to approximately 0.01 mil while still maintaining good adhesion. A preferred range for the thickness of the electroless copper is 0.06 to 0.10 mils.

Before subjecting the board to the actual plating bath, it is common practice to use a predip to protect the activator to be used in the plating process, although such step is sometimes omitted. The predip is typically an activator solution of hydrochloric acid and sodium chloride.

The activator treatment which follows the predip involves immersion in a hydrochloric acid-sodium chloride solution which also includes a tin chloride-palladium chloride colloid. As is known, such treatment leaves a palladium coating over the surface of the board and in the via holes, on which the copper will plate readily, after which it will plate on itself. The tin is included primarily to help keep the palladium in suspension and to promote adhesion. Enthone 444 is a commercial preparation sold for this treatment. The rinse that followed used water slightly acidified with hydrochloric acid. Additionally, it was found advantageous for improving subsequent adhesion of the copper to bubble air through the water with sufficient intensity to promote vigorous agitation of the bath. It is customary to follow the activator treatment with a post activation or accelerator treatment to remove some of the tin and expose the palladium. Enthone PA 493 is a commercially available preparation generally used for this treatment. In this case, it was found advantageous for improved copper adhesion not to bubble air through the water during rinsing.

At this point, the board is ready for immersion in the bath for the actual electroless plating of the copper. This is done in conventional fashion to realize a coating thickness of between 60 and 100 microinches (0.06–0.1 mil). Typically this involves immersion for the requisite time in a bath of copper sulphate, formaldehyde and sodium hydroxide and a chelating agent such as quadrol. It was found advantageous to operate at the higher ends of both the normal temperature range and copper concentration range in plating. In particular, while the bath temperature normally used in industry may be in the range between about 110 and 125 degrees Fahrenheit, in this case operation between about 117 and 125 degrees Fahrenheit proved superior. Similarly, while the bath normally used by the industry has a copper concentration in the range of about 8 grams to 12 grams per liter, in this case the range of between 10 and 12 grams seemed superior. Moreover, it was found desirable to bubble air through the bath at a slow rate to provide only mild agitation of the bath.

Various modifications are possible in the basic process discussed to this point, some of which already have been mentioned.

In particular, it is sometimes helpful to follow the ceric sulphate treatment with a sulfuric acid dip particularly when high concentrations of the ceric sulphate have been used. This appears to facilitate complete removal of the ceric sulphate to ready the board for further processing, particularly if the cleaner-conditioner treatment mentioned earlier is practiced before the cerium sulphate treatment.

After the copper has been plated to the desired thickness, the board is available for use in conventional fashion. However, because the thickness of the copper on the board is thinner than in past practice, the subsequent processing of the board to pattern a desired printed circuit is eased. In particular, shorter times are needed for etching the desired pattern and the amount of etchants used is reduced. These factors tend to lower the final cost of the printed circuits without any sacrifice in quality.

Typically the patterning process involves first rinsing off the plating solution and then immersing the boards in a deoxidizer to remove any tarnish formed during the rinsing and transporting, as well as to retard further oxidation.

Next, the desired plate resist pattern is printed on each of the two surfaces of the board, typically either by a silk screen process or photolithography. The boards are then selectively electroplated through the resist with electrically conductive copper for creating the desired circuitry. A copper plating of from 1.0 mil to 1.5 mils is typical. This copper plating in turn is then plated with a tin-lead (60/40) solder which will be useful for soldering electrical components to the circuit on the board, and also acts as an etch resist in subsequent processing. A tin-lead plating of between 0.3 mil and 0.5 mil is typical.

This is now followed by stripping of the plating resist to bare the copper to be removed and to leave the desired circuit pattern. This exposed copper is etched to the bare laminate or fiber glass base. A solution of hydrogen peroxide and sulfuric acid is useful for this purpose. Alternately, ammoniacal etchants can be used for this purpose. Since only thicknesses of between 60 and 100 microinches of copper needed to be removed from the improved boards, the time and the amount of etching solution needed is considerably reduced. It is also typical to follow this with a solder cleaning treatment to remove any oxides formed by the etchants on the tin-lead solder.

Another embodiment of the present invention begins with the preparation of a board of FR-4, FR-5 or polyimide material which has a copper cladding on both sides which is about 0.7 mil thick. Needed holes through the board are then drilled. The drilled boards are then subjected to a cleaner conditioner solution such as Enthone 7753 or PC 475. The copper cladding is then removed from both sides of the board by etching either with a solution of copper chloride or a solution which includes hydrogen peroxide and sulfuric acid. The board is then treated with an aqueous cerium sulfate solution of a concentration of 0.05-0.1 moles per liter at 100 degrees Fahrenheit for three minutes. Subsequently the board is dipped in a ten percent solution of sulfuric acid. The board is now ready for electroless-copper plating and is processed as is discussed previously.

The invention has proved of special interest in the recovery for replating of scrap boards previously plated with electroless copper. In the past, it has been extremely difficult to recover such boards because of the necessity to remove all of the copper and get to the bare board before replating is feasible. The invention has made feasible the recovery of such boards simply by stripping the board bare in copper chloride as previously described and following this up with the process of the invention.

It should be understood that various modifications may be made in the specific processing described without departing from the spirit and scope of the invention. For example, it should be possible to condition a virgin board by mechanical working of the surface to create therein surface conditions which are similar to that created by the cold pressing of the copper foil thereto, as is characteristic of the commercially available copper-clad boards discussed above. Moreover, in such instances it might be unnecessary to further condition the surface with a strong oxidizing treatment and it might be possible to plate electroless copper directly to such boards. Still further, the boards could be of material other than FR-4, FR-5 and polyimide.

The embodiments of the invention in which an exclusive property or privilege is claimed are defined as follows:

We claim:

1. A process of preparing a copper-plated insulating board suitable for patterning for forming a printed-circuit board comprising the steps of baring the cladding from a board of glass fiber laminations in an epoxy binder to whose surfaces copper foil had previously been clad by a pressing operation, said surfaces being essentially free of any noble metal catalytic activating agents, immersing the bare board in a non-complexed tetravalent cerium solution for a time and at a temperature to prepare the surfaces for copper plating, and electroless plating of copper to the surfaces of the board to a thickness suitable for use.

2. The process of claim 1 in which the tetravalent cerium solution is a solution of ceric sulphate.

3. The process of claim 2 in which the initial cladding is removed by etching in a copper chloride solution.

4. The process of claim 2 in which the immersion is in a 0.02-0.10 molar ceric sulphate solution.

5. The process of claim 4 in which the solution is at a temperature in the range of between about 100 and 120 degress Fahrenheit or above about 180 degrees Fahrenheit.

6. The process of claim 1 in which the copper is plated to a thickness of between 0.010 and 0.16 mils.

7. The process of claim 6 in which the copper is plated to a thickness of between 0.06 and 0.1 mils.

8. The process of claim 7 in which the solution is a 0.06 molar ceric sulphate solution at about 100 degress Fahrenheit and the immersion is for several minutes.

9. The process of claim 1 in which the copper-plated insulating board is a board which had previously been plated with electroless copper.

10. A process of preparing a copper-plated insulating board suitable for patterning for use as a printed circuit board comprising the steps of immersing a board, which is made of glass fiber laminations in an epoxy binder and is substantially free of any noble metal catalytic activating agents and which has been mechanically worked to provide its surfaces with microstructure, in a non-complexed tetravalent cerium solution to prepare the surfaces for copper plating and then electroless plating the copper to the board to a desired thickness.

11. The process of claim 10 in which the solution is a 0.02–0.10 molar ceric sulphate solution.

12. A process of preparing a copper-plated insulating board suitable for patterning for use as a printed circuit board which comprises the steps of baring the cladding from an insulating board to whose surfaces copper foil of a first thickness had previously been clad by a pressing operation, treating the bare board with ceric sulfate, electroless plating a copper layer of a second thickness over such bared and treated board, said first thickness being relative large as compared to said second thickness, applying an electroplating resist pattern onto said electrolessly plated copper layer, electroplating a copper layer onto first portions of said electrolessly plated copper layer left exposed by said resist pattern, electroplating a layer of another metal onto said electroplated copper layer, removing said electroplating resist to expose second portions of said electrolessly plated copper layer not covered by said electroplated layers, and selectively etching away said second portions of the electrolessly plated copper layer using the layer of another metal as an etch resist.

13. The process of claim 12 in which said first thickness is at least several tenths of a mil and said second thickness is no greater than one tenth of a mil and the other metal is a tin-lead solder.

14. A process of preparing a copper-plated insulating board suitable for patterning for forming a printed-circuit board comprising the steps of baring a board of glass fiber lamination in an epoxy binder to whose surfaces copper foil had previously been clad by a pressing operation, said surfaces being essentially free of any noble metal catalytic activating agents, subjecting the board to a cleaner conditioner solution, immersing the board in a non-complexed tetravalent cerium solution for a time and temperature to prepare its surface for copper plating, rinsing the board in water acidified with sulfuric acid, subjecting the board again to a cleaner conditioner solution, immersing the board in an activator solution, rinsing the board in water acidified with hydrochloric acid and vigorously agitated, immersing the board in an accelerator solution, rinsing the board in water which is not agitated, and immersing the board in a copper plating bath which is mildly agitated.

15. The process of claim 14 in which the tetravalent cerium solution is a 0.02–0.10 molar ceric sulphate solution maintained at a temperature of about 100 to 120 degress Fahrenheit or above about 180 degrees Fahrenheit.

* * * * *